United States Patent
Afzali-Ardakani et al.

(10) Patent No.: US 9,245,896 B2
(45) Date of Patent: *Jan. 26, 2016

(54) JUNCTION FIELD-EFFECT FLOATING GATE QUANTUM DOT MEMORY SWITCH

(71) Applicant: International Business Machines Corporation, Armonk, NY (US)

(72) Inventors: Ali Afzali-Ardakani, Ossining, NY (US); Tze-Chiang Chen, Yorktown Heights, NY (US); Kailash Gopalakrishnan, San Jose, CA (US); Wilfried Ernst-August Haensch, Somers, NY (US); Bahman Hekmatshoartabari, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/181,381

(22) Filed: Feb. 14, 2014

(65) Prior Publication Data

US 2015/0236029 A1    Aug. 20, 2015

(51) Int. Cl.
 H01L 29/76    (2006.01)
 H01L 27/115   (2006.01)
 H01L 29/788   (2006.01)
 B82Y 10/00    (2011.01)
 B82Y 40/00    (2011.01)

(52) U.S. Cl.
 CPC ........ H01L 27/11521 (2013.01); H01L 29/788 (2013.01); B82Y 10/00 (2013.01); B82Y 40/00 (2013.01); Y10S 977/84 (2013.01); Y10S 977/943 (2013.01)

(58) Field of Classification Search
 CPC .............. H01L 27/11517; H01L 27/11563; H01L 29/66833
 USPC .......... 257/314, 315, 320, 321, 324
 See application file for complete search history.

(56) References Cited

U.S. PATENT DOCUMENTS

| 6,060,743 | A | 5/2000 | Sugiyama |
| 6,333,214 | B1 | 12/2001 | Kim |
| 6,459,120 | B1 | 10/2002 | Shima |
| 2006/0145136 | A1 | 7/2006 | Verhoeven |
| 2009/0184346 | A1 | 7/2009 | Jain |
| 2010/0006921 | A1 | 1/2010 | Makihara et al. |

FOREIGN PATENT DOCUMENTS

| DE | 19929926 | 10/2006 |
| JP | 11087544 | 3/1999 |
| JP | 2005302996 | 10/2005 |
| JP | 2008270705 | 11/2008 |

OTHER PUBLICATIONS

El-Sayed Hasaneen et al., "Nonvolatile Quantum Dot Memory (NVQDM) in Floating Gate Configuration: Device and Circuit Modeling", 2003, pp. 741-744, IEEE.

*Primary Examiner* — Tan N Tran
(74) *Attorney, Agent, or Firm* — Louis J. Percello; Otterstedt, Ellenbogen & Krammer, LLP

(57) ABSTRACT

A dense binary memory switch device combines the function of a pass transistor and a memory cell and has low programming and operation voltages. The device includes a charge storage region coupled to a gate electrode through a gate dielectric layer and to a channel region through another dielectric layer. The charge storage region is charged by carriers injected from injection regions that are in direct contact with the charge storage region. Fabrication of the device at low temperatures compatible with back-end-of-line processing is further disclosed.

20 Claims, 8 Drawing Sheets

- $V_G < 0 \rightarrow$ HOLE ACCUMULATION IN FLOATING GATE (AND CHANNEL)

JUNCTION FIELD-EFFECT FLOATING GATE QUANTUM DOT MEMORY SWITCH

FIELD

The present disclosure relates to the physical sciences and, more particularly, to memory switch devices and methods of fabrication thereof.

BACKGROUND

Field programmable gate arrays (FPGAs) are integrated circuits generally characterized by configurable logic blocks with programmable interconnects. FPGAs are designed to be reprogrammed subsequent to manufacture. A combination of a pass transistor and a memory cell such as static random access memory (SRAM) is conventionally used as a binary memory wiring switch in FPGAs. The area taken by the pass transistor and the SRAM cell (comprised of several transistors) is a large fraction of the total area inside a FPGA.

SUMMARY

Principles of the present disclosure provide a field-effect floating gate memory device including a channel region having a conductivity type and adjoining an electrically insulating substrate, doped source and drain regions operatively associated with and having the same conductivity type as the channel region, and a gate operatively associated with the channel region. A charge storage region includes a semiconductor layer containing quantum structures, deep traps or combinations thereof, and is located between the gate and channel region. Carrier injection regions are in direct contact with the charge storage region for providing charges to the quantum structures and/or deep traps. A first dielectric layer is between the channel region and the charge storage region and a second dielectric layer is between the gate and the charge storage region.

An exemplary method includes providing a field-effect floating gate memory device including a channel region having a conductivity type and adjoining an electrically insulating substrate, doped source and drain regions operatively associated with and having the same conductivity type as the channel region, a gate operatively associated with the channel, a charge storage region including a semiconductor layer containing quantum structures and/or deep traps between the gate and channel, carrier injection regions in direct contact with the charge storage region for providing charges to the quantum structures and/or deep traps, a first dielectric layer between the channel region and the charge storage region, and a second dielectric layer between the gate and the charge storage region. A gate bias is applied, causing the injection of carriers into the charge storage region. The carriers are retained by the quantum structures and/or deep traps.

A method provided in accordance with the principles described herein includes providing a structure including an electrically insulating substrate, a channel region adjoining the electrically insulating substrate, and doped source and drain regions operatively associated with the channel region, the channel region and doped source and drain regions having the same conductivity type. The method further includes forming a first dielectric layer on the channel region and forming a charge storage region on the first dielectric layer, the charge storage region including a semiconductor layer containing quantum structures and/or deep traps. A carrier injection layer is formed in direct contact with the charge storage region for providing charges to the quantum structures and/or deep traps. A gate dielectric layer is formed on the charge storage region and a gate is formed on the gate dielectric layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Junction field-effect quantum dot structures and fabrication methods as disclosed herein can provide substantial beneficial technical effects. For example, one or more embodiments may provide one or more of the following advantages:

Combined function of pass transistor and memory cell with relatively low programming and operation voltages;
Choice of device architectures;
Applicability to field-programmable gate arrays;
Spatial efficiency;

These and other features and advantages will become apparent from the following detailed description of illustrative embodiments thereof, which is to be read in connection with the accompanying drawings.

DETAILED DESCRIPTION

A dense binary memory switch which combines the function of a pass transistor and a memory cell with low programming and operation voltages is disclosed in accordance with exemplary embodiments as discussed below. The disclosed devices include channel regions similar to those found in junction field-effect transistors. A charge storage region is coupled to a gate electrode through a gate dielectric layer and coupled to the channel region through another dielectric layer. Methods for fabricating such memory switches at low temperatures compatible with back-end-of-the-line (BEOL) processing are further disclosed.

Figure 1:
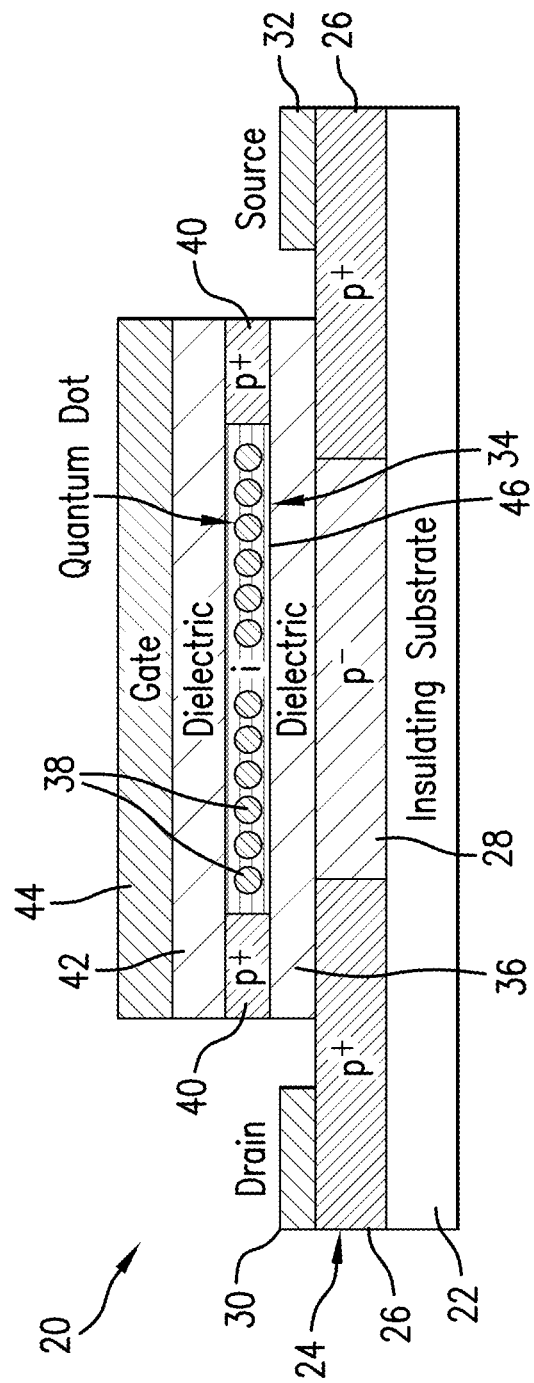
FIG. 1 is a schematic sectional view of a binary memory switch.

An exemplary device 20 designed to function as a "normally ON" transistor structure is shown in FIG. 1. The device includes an electrically insulating layer 22 such as a buried oxide (BOX) layer. Silicon dioxide is among the materials from which the insulating layer may be formed. A semiconductor layer 24 including highly doped source and drain regions 26 and a channel region 28 adjoin the electrically insulating layer 22. The source and drain regions have the same conductivity type as the substrate semiconductor layer 24. In one or more exemplary embodiments, the source and drain regions 26 are p+ and the channel region is p−. A drain electrode 30 is formed directly on one of the regions 26 and a source electrode 32 is formed directly on the other of the regions 26. The semiconductor layer 24 is formed from laser-crystallized polysilicon in some exemplary embodiments.

A charge storage region 34 is coupled to the channel region 28 through a dielectric layer 36. The charge storage region includes a semiconductor layer 46 containing quantum dots 38. In some embodiments, the semiconductor layer 46 may be comprised of quantum wells instead of quantum dots or a combination thereof. In some embodiments, charge is stored in the deep (i.e. near-midgap) traps in the charge storage region 34 and the quantum structures are optionally omitted. In other embodiments, the charge storage region contains combinations of quantum structures and deep traps. In one or more embodiments, the dielectric layer 36 is a high-k dielectric layer such as hafnium oxide, the semiconductor layer is an intrinsic silicon layer, and the quantum dots are germanium nanodots. In one or more embodiments, the intrinsic layer is comprised of organic materials such as pentacene and the quantum dots are comprised of metal nano-particles or nano-dots such as gold. Injection regions 40 are in direct contact with the charge storage region 34. The quantum dots 38 are charged by carrier injection from the carrier injection regions 40. A second (gate) dielectric layer 42 such as a high-k dielectric layer adjoins the storage region 34. A gate 44 adjoins the second dielectric layer and is functional as a control gate, as described further below. The quantum dots 38 are accordingly coupled to the gate 44 and channel region 28 through the dielectric layers 36, 42. The gate 44 at least partially overlies the injection regions 40 so that the gate electric field can reduce the potential barrier for carrier injection from the injection regions into the charge storage region 34.

Prior to programming, the exemplary device 20 is normally ON. The term "normally ON" means that the channel region 28 is not fully depleted, i.e. either partially depleted or not depleted. As known to those skilled in the art, this depends on the workfunction of the material used for gate electrode 44, the thicknesses and dielectric constants of the dielectric layers 42 and 36, the doping, thickness and dielectric constants of the charge storage region 34 and the channel region 24, as well as the presence of fixed charge or interface charge in the dielectric layers or pre-existing charge in the quantum dots 38. In one example where the charge storage region 34 is intrinsic with no pre-existing charge stored in the quantum dots or in the deep traps in the storage region, and there is no fix or interface charge associated with the dielectric layers 42 and 36, the workfunction difference between the channel layer 28 and the gate electrode may be expressed as $\Delta_\phi = \Phi_S - \Phi_G$, where $\Phi_G$ is the workfunction of the gate electrode material, $\Phi_S$ is the workfunction of the p-type semiconductor material forming the channel layer 28, which may be expressed as $\Phi_S = E_i + \chi_e + (kT/q) \cdot \ln(N_A/n_i)$, where $E_i$ is the intrinsic Fermi level with respect to the conduction band edge, $\chi_e$ is the electron affinity, $N_A$ is the concentration of acceptors, k is the Boltzmann constant, T is the absolute temperature, q is the charge of an electron, and $n_i$ is the intrinsic carrier concentration. The intrinsic Fermi level $E_i$ may be expressed as $E_i = E_g/2 - (kT/q) \cdot \ln(N_V/N_C)$, where $E_g$ is the bandgap (~1.1 eV in silicon), $N_V$ the effective density of states in the valence band, and $N_C$ the effective density of states in the conduction band. In silicon, $N_C \approx N_V$ and therefore $E_i \approx E_g/2$. $E_i$ and $\chi_e$ (~4.05 eV in silicon) are independent of the doping concentration $N_A$. If $\Delta_\phi < 0$, the channel is not depleted and the device is normally ON. If $\Delta_\phi > 0$ the channel is either partially or fully depleted. In this case, the depletion region width $W_D$ may be estimated from the following relation: $q^2 N_A W_D = \Delta_\phi / (W_D/\in_{24} + t_{42}/\in_{42} + t_{36}/\in_{36} + t_{34}/\in_{34})$, where $\in$ and t denote the dielectric constants and the thicknesses of the subscripted regions, respectively. The term $qN_A W_D$ represents the total charge associated with ionized acceptors in the depleted portion of the channel. The term $\in_{24}/W_D$ represents the depletion capacitance per unit area of the depleted region (i.e. channel) and the terms $\in_{42}/t_{42}$, $\in_{36}/t_{36}$ and $\in_{34}/t_{34}$ represent the capacitances per unit areas of the dielectric layers 42 and 36 and the intrinsic charge storage region 34, respectively. If $W_D$ calculated from this relationship is equal or larger than the thickness of the channel region 24, the channel region is fully depleted and the device is normally OFF. If $W_D$ is smaller than the thickness of the channel region, the channel region is partially depleted and the device is normally ON. A negative gate bias is applied to perform a write function. Upon application of a negative bias to the gate of the exemplary device 20, holes are induced in the intrinsic semiconductor layer 46 and the quantum dots 38 therein. In one embodiment, during the write time, accumulation takes place in the p− channel region 28. In one example, after write, the gate bias is removed (i.e. the gate electrode is electrically floating) and holes are retained in the quantum dots 38. Provided that there is sufficient positive charge (holes) trapped in the quantum dots, the p− channel region is fully depleted and the device turns off and stays off. In this example, if the total positive charge stored in the storage region per unit area of the storage region is denoted as $Q_p$, $W_D$ may be calculated by replacing $\Delta_\phi$ by $\Delta_\phi + Q_p/C_{eq}$ in the above equation, where $C_{eq}$ is an equivalent capacitance. In one embodiment, where quantum dots are in direct contact with the dielectric layer 36, $C_{eq} = (t_{42}/\in_{42} + t_{34}/\in_{34})^{-1}$. In another embodiment, where quantum dots are in direct contact with the dielectric layer 42, $C_{eq} = (t_{42}/\in_{42})^{-1}$. In another embodiment, where quantum dots are disposed in the middle of the charge storage layer 34, $C_{eq} = (t_{42}/\in_{42} + t_{34}/\in_{34}/2)^{-1}$. Since $Q_p$ is a positive number, the value of $W_D$ calculated from the above equation is always increased by adding the term $Q_p/C_{eq}$ to $\Delta_\phi$. Therefore with sufficiently large $Q_p$, $W_D$ can become equal or exceed the thickness of the channel region, and therefore the channel becomes fully depleted and the device turns off. Alternatively, after write, the gate may be connected to an "idle" bias voltage $V_{idle}$. The idle voltage is preferably positive, although a negative voltage may be used as well. In this case, $\Delta_\phi$ may be replaced by $\Delta_\phi + V_{idle} + Q_p/C_{eq}$ in the above equation to estimate $W_D$. For appropriate device operation, $W_D$ is smaller than the thickness of the channel layer (or has a negative value) when $Q_P = 0$ (i.e. $\Delta_\phi$ replaced with $\Delta_\phi + V_{idle}$ in the above equation) thus ensuring a normally-ON device when there is no charge stored in the storage layer. After the write period, the stored charge $Q_p$ must be sufficiently large to ensure $W_D$ (calculated by replacing $\Delta_\phi$ with $\Delta_\phi + V_{idle} + Q_p/C_{eq}$) is equal or larger than the thickness of the channel layer. If the device functions as a non-volatile memory, a positive gate bias is applied to perform an erase function. Such a positive bias causes the removal of charge from the quantum dots 38. If the device functions as a volatile memory, the erase function may be omitted.

Figure 2:
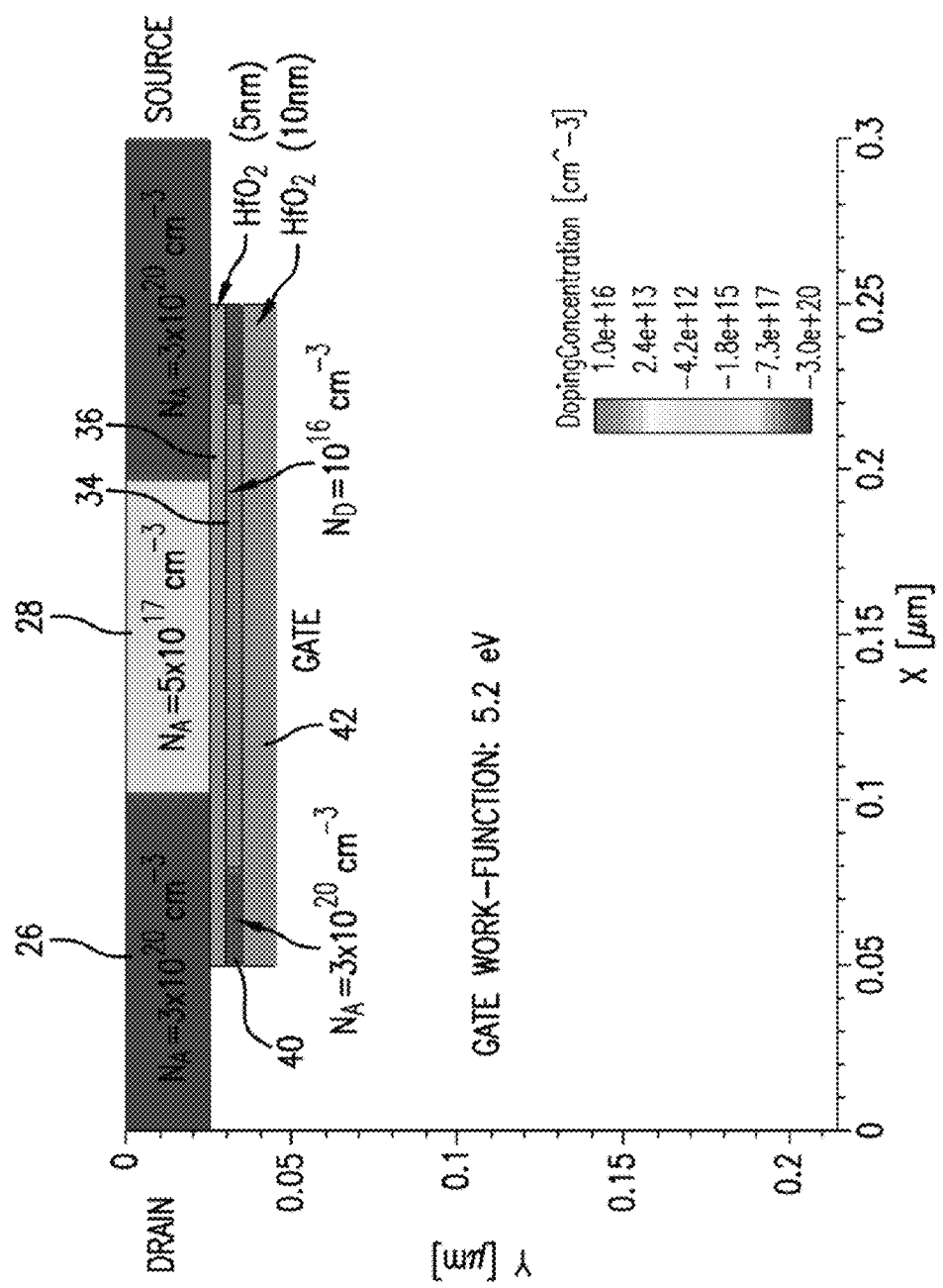
FIG. 2 is a technology computer-aided simulation of an exemplary memory switch showing exemplary acceptor and donor concentrations.
Figure 3:
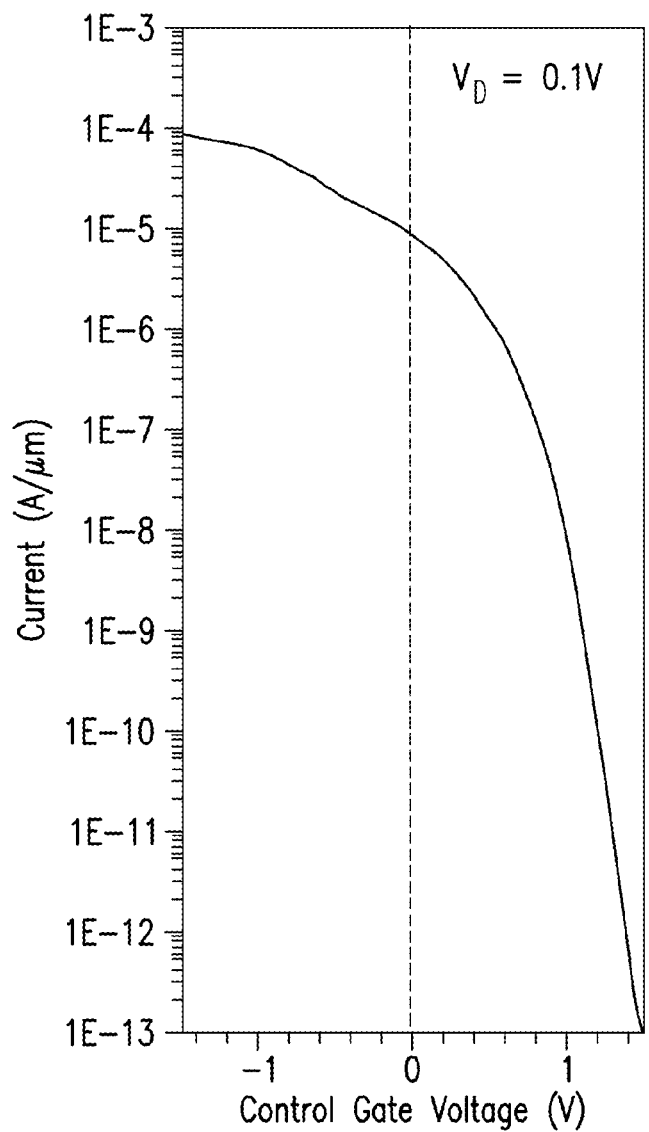
FIG. 3 is a graph showing drain current as a function of control gate voltage of an exemplary memory switch.

FIG. 2 shows a technology computer-aided design (TCAD) simulation of an exemplary device with no charge storage elements (i.e. quantum dots, quantum wells or deep traps) in the charge storage region, including dimensions and acceptor/donor concentrations. The p– channel region 28 of the exemplary device has an acceptor concentration ($N_A$) of $5 \times 10^{17}$ cm$^{-3}$ while the adjoining and more heavily doped p+ source and drain regions each have acceptor concentrations of $3 \times 10^{20}$ cm$^{-3}$. The charge storage region 34 of the floating gate has a donor concentration ($N_D$) of $10^{16}$ cm$^{-3}$. The p+ carrier injection regions 40 adjoining the charge storage region 34 have acceptor concentrations of $3 \times 10^{20}$ cm$^{-3}$. The gate workfunction of the device is 5.2 eV. The hafnium oxide dielectric layers 36, 42 have thicknesses of five nanometers and ten nanometers, respectively. The floating gate dimensions, which include both the charge storage region 34 and the adjoining contact regions 40, are 200 nm×5 nm×1 μm in an exemplary embodiment. The channel region 28, the source and drain regions 26, the charge storage region 34 and the injection regions 40 in the exemplary embodiment are comprised of silicon. As discussed above, the write function involves applying a negative gate bias ($V_G < 0$), resulting in hole accumulation in the floating gate 34, 40 and channel 28. Programming is accordingly facilitated through the application of a gate bias less than zero. In this example, the density of accumulated holes in the charge storage region 34 varies from approximately $10^{18}$ cm$^{-3}$ to $10^{20}$ cm$^{-3}$ from (in the vertical direction) the interface with the bottom dielectric layer 36 to the interface with the top dielectric layer 42. FIG. 3 is a graph showing drain current as a function of control gate 44 voltage, the drain voltage $V_D$ being 0.1V. In contrast, if $V_G > 0$, hole depletion occurs in the channel 28; such a regime is not of interest for programming the exemplary device.

Figure 4:
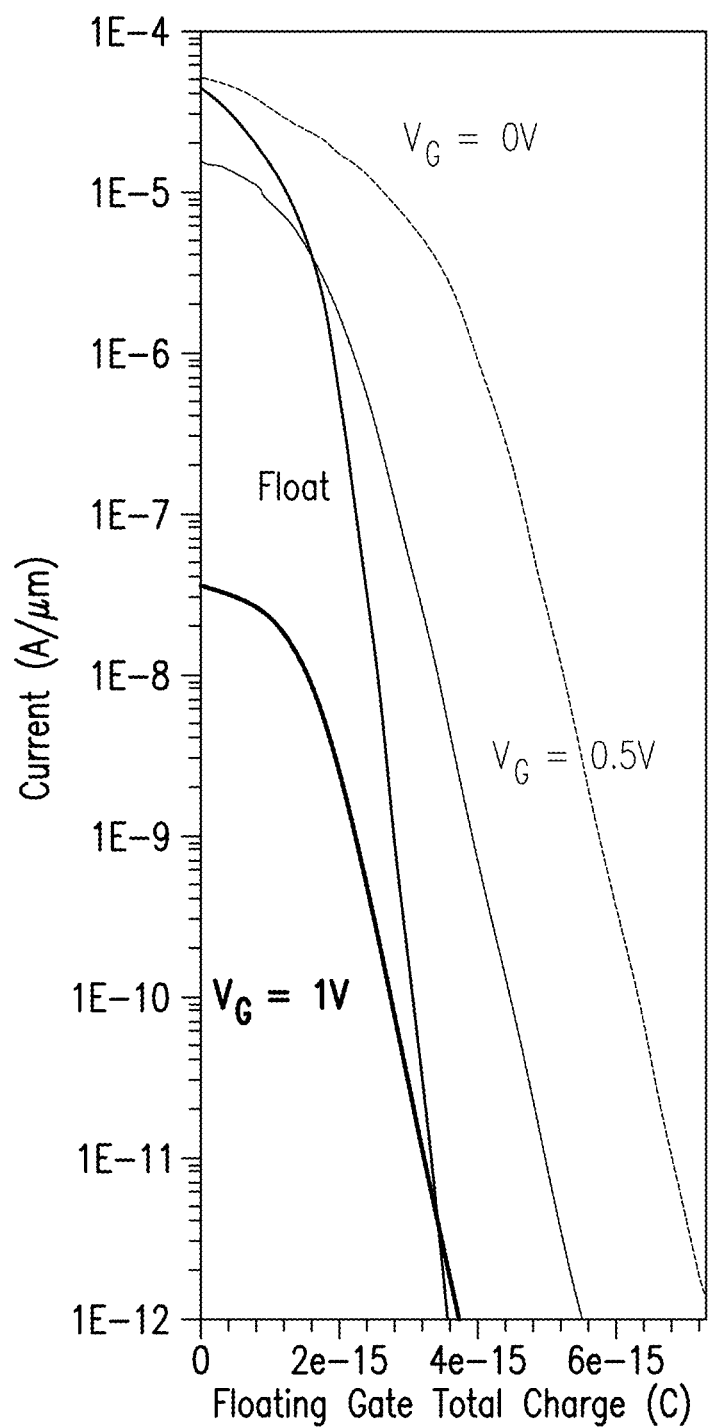
FIG. 4 is a graph showing drain current as a function of floating gate total charge (C) of an exemplary memory switch.

As discussed above, the gate is either float or at preferably positive idle voltage following programming. FIG. 4 is a graph showing TCAD simulation examples of drain current vs. the total stored charge in the floating gate for the device having floating gate dimensions indicated above. In the simulation example for a read function, $2 \times 10^{19}$ cm$^{-3}$ holes are stored in the floating gate. Q=200 nm×5 nm×1 μm×$2 \times 10^{19}$ cm$^{-3}$×$1.6 \times 10^{-19}$ C=$3.2 \times 10^{-15}$C where the drain voltage is 0.1V and the control gate is float. (Q represents the total charge stored in the floating gate in Coulombs.) The channel 28 is depleted of holes due to the positive charge in the floating gate. The drain current can be modulated by several orders of magnitude as a function of stored charge in the floating gate, indicating a high ON/OFF ratio for the device.

One or more embodiments of the devices discussed herein may function as non-volatile or volatile binary or multi-state memory. As known to those of skill in the art, the retention time is a function of the localization energy determined by quantum confinement in the well or dot. Estimated retention times of a wide variety of adjoining III-V and other materials have been calculated and are known in the art. For example, the storage times of Si/Ge and GaAs$_{0.4}$Sb$_{0.6}$/GaAs are relatively short while the storage times of GaSb/GaAs, In$_{0.5}$Ga$_{0.5}$Sb/GaAs and InSb/GaAs are relatively long. The localization energy depends on band offsets as well as doping and/or bias. Metals in organic material, as employed in one or more embodiments, also provide varying retention times. For example, gold nanodots in pentacene exhibit a retention time of a few hours.

In one or more embodiments, the floating gate structure includes an organic (e.g. pentacene) layer and a self-assembled monolayer (SAM) of gold that adjoins a dielectric layer, which is hafnium oxide in some exemplary embodiments. Gold particles create deep states in pentacene (which has a bandgap of approximately 2.1 eV) and retention times exceeding one hour. Self-assembly of gold nanoparticles on metal oxides (e.g. aluminum oxide, hafnium oxide) can be achieved by procedures known to the art. In one exemplary procedure, the oxide surface is coated with a monolayer of a bifunctional compound having a functionality that adheres to the surface of the oxide (e.g. hydroxamic acid, phosphonic acid) and a charge moeity. For example, pyridine hydroxamic acid methiodide has a hydroxamic acid functionality which self assembles on metal oxide surfaces and a charged moeity (pyridinium salt). After self-assembly of this molecule to form a monolayer on the oxide surface, the positive surface charge of the self-assembled monolayer (SAM) attracts negatively charged molecules or particles. Gold nanoparticles are coated with a ligand. In the case of water soluble gold nanoparticles, the ligand is usually is a charged molecule such as citrate salt which carries a negative charge on the surface of gold nanoparticles. Therefore, when a substrate with positively charged SAM is immersed in a solution of negatively charged gold nanoparticles, the gold particles are attracted to positively charged SAM through coulombic attraction, forming electrostatic bonds and adhering to the surface of the oxide substrate. In one exemplary alternative procedure, molecules having hydroxamic functionality that causes adherence to an oxide surface and thiol functionality that can attract gold nanoparticles from solution (water or solvent) is employed.

A further alternative method of forming gold nanodots directly on the surface of a dielectric layer is by flash-evaporation of gold, as known in the art. In this method, gold is evaporated in a vacuum chamber using known techniques and a shutter (used for physically blocking the sample from gold evaporation) is opened only for a short period of time to allow deposition on the sample. When the shutter is closed, gold is deposited on the shutter rather than on the sample. Short deposition times result in nanodot formation on the surface of the dielectric layer rather than a continuous layer of gold. In one example, an evaporation rate of 1 Å/sec and an evaporation time (the period the shutter is open) of five (5) seconds is used. In another example, an evaporation rate of 0.1 Å/sec and an evaporation time of fifty (50) seconds are used. In another example, an evaporation rate of 1 Å/sec and an evaporation time of ten (10) seconds are used. The evaporation rate and time are chosen such that the product of the evaporation time and evaporation rate is preferably lower than 2 nm and more preferably lower than 1 nm. (1 nm=10 Å, A=angstrom). In some embodiments, the gold nano-dots are not in direct contact with the dielectric layer 36. In these embodiments, a layer of pentacene in evaporated first, followed by flash evaporation of gold, as described above, followed by the evaporation of a second layer of pentacene. Therefore, the gold nano-dots are embedded within a layer of pentacene. In other embodiments, the second pentacene evaporation is omitted so that the gold nano-dots are in direct contact with the dielectric layer 42. In some other embodiments, multiple steps of gold and pentacene evaporation may be used to form more than one layer of gold nano-dots. In some embodiments, the gold nano-dots are distributed randomly within the pentacene charge storage region. In one example, the gold nano-particles are mixed in a solution containing a pentacene precursor such as 13,6-N-Sulfinylacetamidopentacene, and applied by spin-coating and cured to form a pentacene layer containing gold nano-particles. A solvent such as chloroform, chlorobenzene or combinations thereof may be used to prepare the solution. Curing may be performed at temperatures close to 200° C. in a dry atmosphere, although lower temperatures may be used as well.

Figure 5:
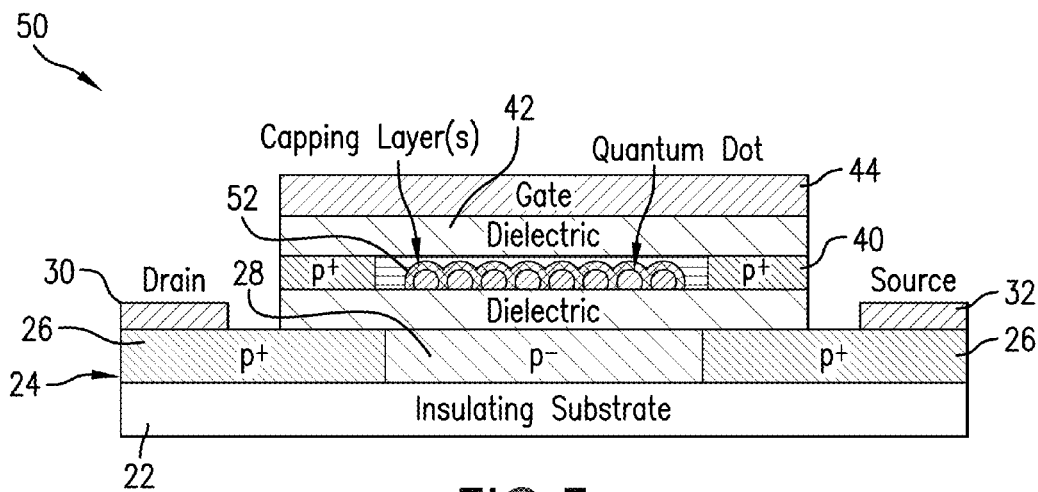
FIG. 5 is a schematic sectional view of an alternative embodiment of a binary memory switch including quantum dots and a capping layer on the quantum dots.
Figure 6:
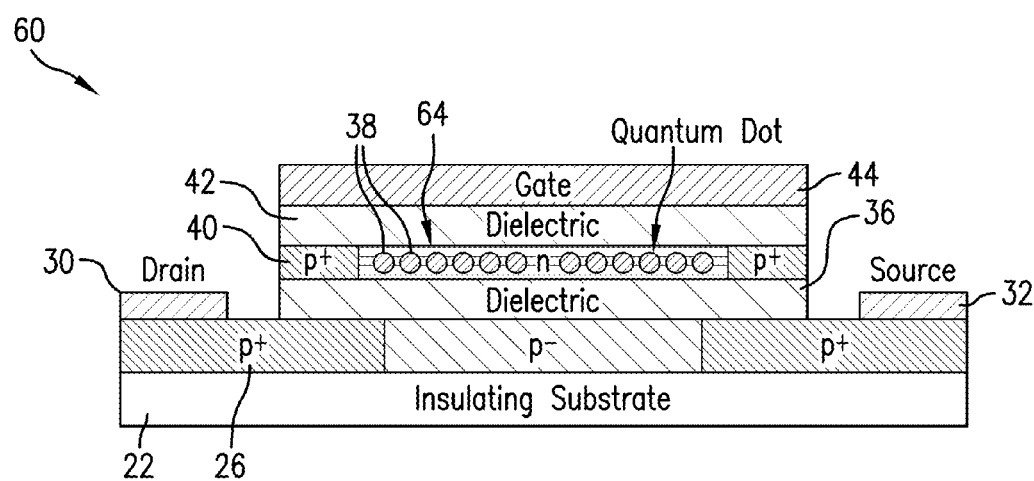
FIG. 6 is a schematic sectional view of an alternative embodiment of a binary memory switch including a storage region having a conductivity type opposite to that of the channel region.

Further exemplary embodiments of junction field-effect floating gate quantum dot memory switch devices are shown in FIGS. 5 and 6. The same reference numerals as employed with respect to FIG. 1 are employed in these figures to designate similar elements. The device 50 shown in FIG. 5 includes a capping layer 52 encasing the quantum dots, which may include a set of layers. The quantum dots 38 are positioned between the capping layer 52 and the dielectric layer 36 that adjoins the channel region 28. In one exemplary embodiment, the quantum dots are comprised of germanium and the capping layer is comprised of amorphous silicon. In another embodiment, the quantum dots are comprised of silicon, silicon germanium or germanium, and the capping layer is comprised of a very thin layer of silicon dioxide (<2 nm). In another exemplary embodiment, the quantum dots are comprised of germanium and the capping layer is comprised of germanium oxide. The capping material preferably has a larger bandgap than the quantum dots to improve charge retention in the quantum dots. The capping layer 52 may be a contiguous layer as shown or discontinuous. The capping layer may further be in direct contact with the dielectric layer 36. In some embodiments, the capping layer may further be in direct contact with the dielectric layer 42 (not shown). In alternative embodiments (not shown), the quantum dots include a core (or cores) and shell(s) over the cores. Several material combinations known as core-shell quantum-dots in the art may be used for this purpose. The shell material has a larger bandgap than the core material, thus improving charge retention in the core material. In one example, the core material is comprised of germanium and the shell material is amorphous silicon. In another example, the core material is comprised of silicon and the shell material is a very thin layer (<2 nm) of silicon dioxide.

Figure 7A:
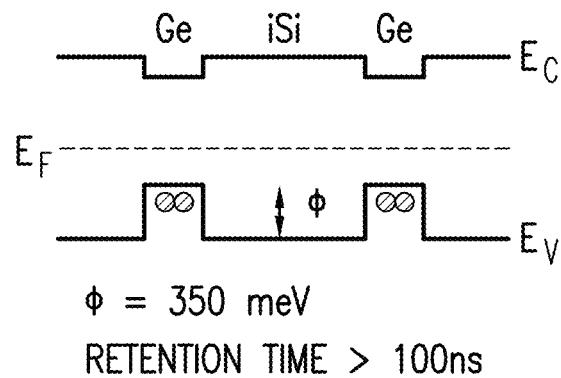
FIG. 7A is a schematic energy band diagram of a device including germanium quantum dots embedded in an intrinsic silicon semiconductor layer.
Figure 7B:
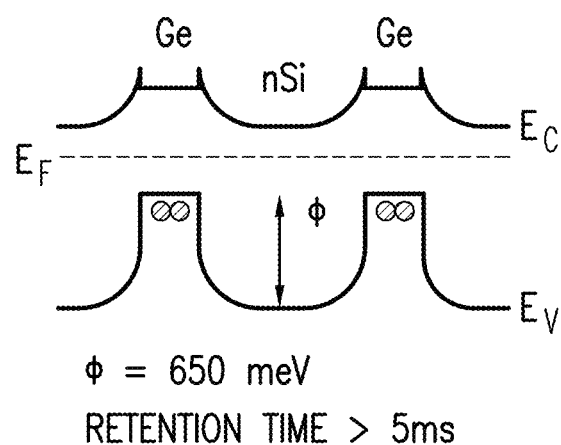
FIG. 7B is a schematic energy band diagram of a device including germanium quantum dots embedded in a n-doped silicon semiconductor layer

Referring to the device 60 shown in FIG. 6, the charge storage region 64 includes n-type doping. In embodiments wherein hole confinement is provided by germanium quantum dots 38 embedded in silicon, n-type doping of the silicon substantially increases the retention time, though at a cost of an increase in the write voltage. Energy band diagrams provided in FIGS. 7A and 7B illustrate the differences in write voltage and retention times of devices employing intrinsic silicon layers and n-type silicon layers containing germanium quantum dots as well as effects within conduction and valence bands of such devices. The same concept may be expanded to materials systems other than germanium dots in silicon by those skilled in the art.

Referring to FIGS. 8A-D, an exemplary method is shown for fabricating back-end-of-line (BEOL) compatible devices. Doped source and drain regions 26 and the channel region 28 are formed using, for example, ion-implantation of a semiconductor-on-insulator substrate. In an exemplary embodiment, the semiconductor layer 24 is laser-crystallized polysilicon. The dielectric layer 36 can be formed using any known technique including but not limited to thermal oxidation, deposition by thermal or e-beam evaporation, sputtering, atomic-layer deposition (ALD) or various chemical vapor deposition (CVD) methods known in the art. Germanium nanodots 38 are formed on the dielectric layer 36. In some exemplary embodiments, rapid thermal chemical vapor deposition is used at temperatures below 400° C. from a germane ($GeH_4$) precursor. Dot size in one or more embodiments is 2-50 nm. A dot size range of 5-25 nm for embodiments including germanium nanodots is employed in other embodiments. In other embodiments, gold nano-particles are self-assembled on the insulator using solution processing as described in further detail above. A hole-transport semiconductor layer 46 is deposited using known techniques. Exemplary materials for forming the semiconductor layer 46 include organic materials such as pentacene, metal-oxide materials such as nickel oxide (NiO) and tin oxide (SnO), and compounds such as CdTe, CIGS, CZTS, CZTSe and CZTSSe. A hole injection layer 82 (metal or p-type semiconductor), gate dielectric layer 42, gate electrode 84, and drain and source electrodes 30, 32 are deposited and patterned using conventional techniques familiar to those of skill in the art. In an exemplary embodiment wherein pentacene is used to form the hole-transport semiconductor layer 46, the hole injection layer is a gold layer. In a further exemplary embodiment that also includes a pentacene layer, the gate dielectric layer 42 is a paralyne layer or an aluminum oxide ($Al_2O_3$) layer.

Figure 9:
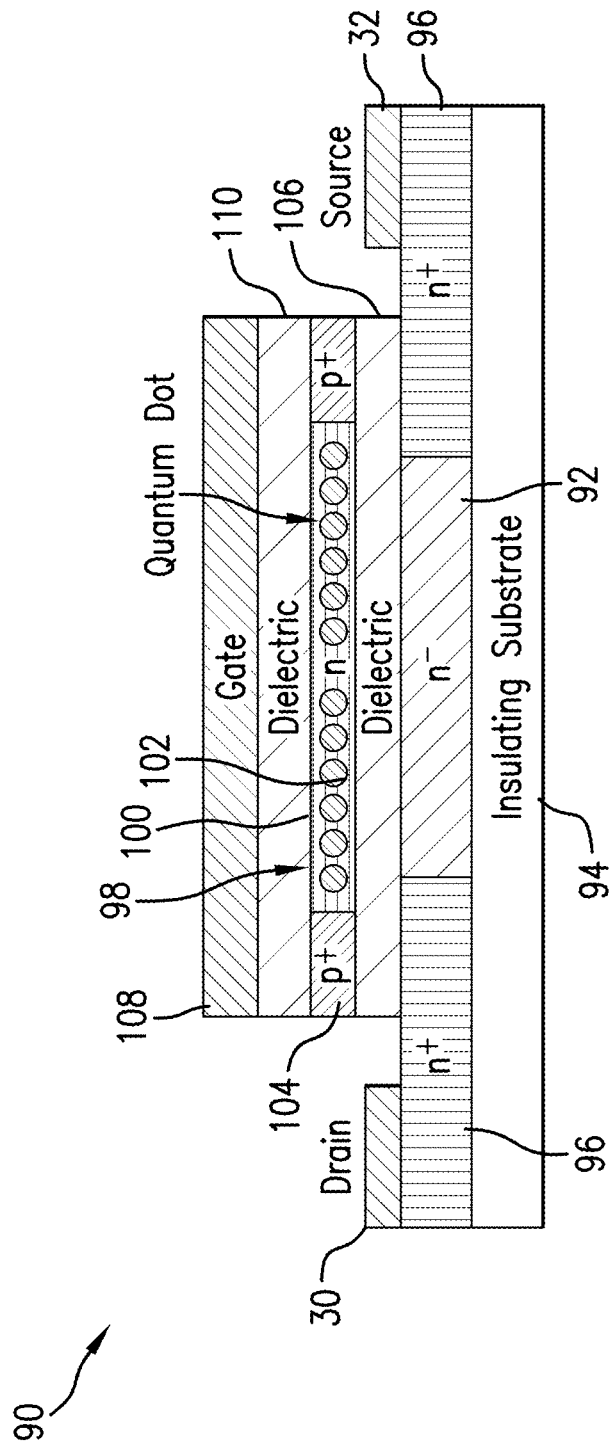
FIG. 9 is a schematic sectional view of an alternative embodiment of a normally-off binary memory switch.

A normally-OFF floating gate quantum dot memory switch device is provided in accordance with one or more further embodiments. Referring to FIG. 9, the device 90 includes an n− channel region 92 formed on an electrically insulating substrate 94. The workfunction difference between the gate electrode and the n− doped the channel region semiconductor may be expressed as $\Delta_\phi = \Phi_G - \Phi_S$, where $\Phi_S = E_i + \chi_e - (kT/q) \cdot \ln(N_D/n_i)$ and $N_D$ is the concentration of donors in the channel region. If $\Delta_\phi < 0$, the channel is not depleted. If $\Delta_\phi > 0$ the channel is depleted and using similar assumptions as that of the example used for the embodiment of FIG. 1, the depletion region width $W_D$ may be estimated from $q^2 N_D W_D = \Delta_\phi / (W_D / \in_{92} + t_{110}/\in_{110} + t_{106}/\in_{106} + t_{100}/\in_{100})$. In an appropriate design, the doping concentration $N_D$ and/or the channel region thickness are sufficiently low to assure $W_D$ calculated from the above equation is larger than the thickness of the channel region. Under these conditions, the channel region 92 is fully depleted before programming, resulting in a normally-OFF transistor structure. Highly doped n+ source and drain regions 96 adjoin the channel region 92. The storage region 98 in some embodiments includes an intrinsic semiconductor, although an n-type semiconductor may be used to improve retention as explained with respect to FIGS. 7A and 7B. The storage region 98 further includes a semiconductor layer 100 containing quantum dots 102. Injection regions 104 are p+ and directly contact the charge storage region 98. The charge storage region 98 is coupled to the channel region 92 through a first dielectric layer 106. A gate electrode 108 and gate dielectric layer 110 are formed above the charge storage region and associated contact regions 104. When a write voltage (negative gate bias) is applied to the device 90, holes are induced in the n-type semiconductor layer 100 and quantum dots 102 while the channel region 92 remains fully depleted and the device remains "OFF". The quantum dots 102 are charged by carrier injection from the p+ regions 104. After "write", the gate bias is removed, the holes are retained in the quantum dots 102, and the channel region 92 is un-depleted. If the trapped charge per unit area of the charge storage region in denoted as $Q_p$, the width of the depletion region $W_D$ can be calculated by replacing $\Delta_\phi$ with $\Delta_\phi - Q_p/C_{eq}$ in the above equation. (Similar equivalent capacitance values used for the example of FIG. 1 can be used). Since $Q_p$ is a positive number, the width of the depletion region is reduced by trapping holes in the charge storage region. If the trapped charge is large enough, $W_D$ becomes smaller than the thickness of the channel region (i.e. $W_D < t_{92}$) and the channel becomes partially un-depleted (if $W_D > 0$) or fully un-depleted (if $W_D = 0$ or $W_D < 0$). The transistor device accordingly turns on and stays on. Alternatively, a preferably negative idle voltage may be applied. A positive gate bias is applied to remove charge from the quantum dots, thereby performing an erase function. The erase function may be omitted for volatile memory applications.

Figure 8A:
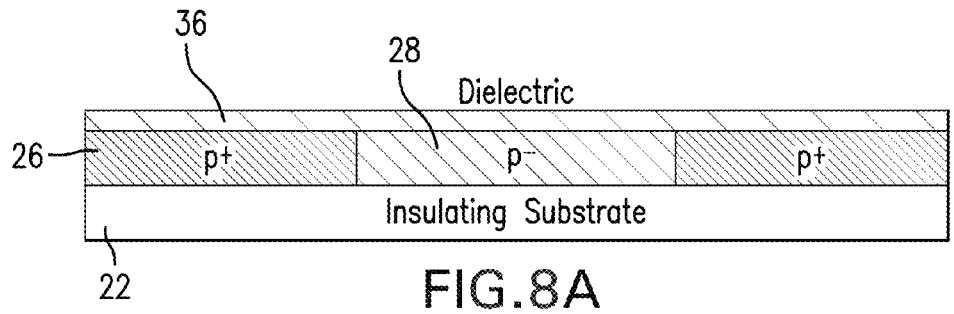
FIGS. 8A-D are schematic illustrations of exemplary fabrication steps for a BEOL-compatible device.
Figure 8B:
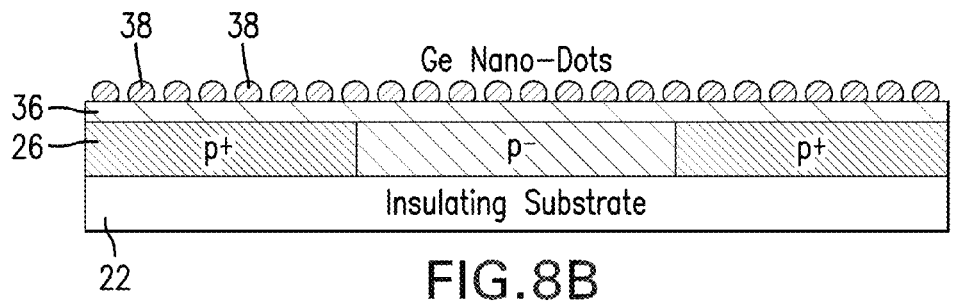
Figure 8C:
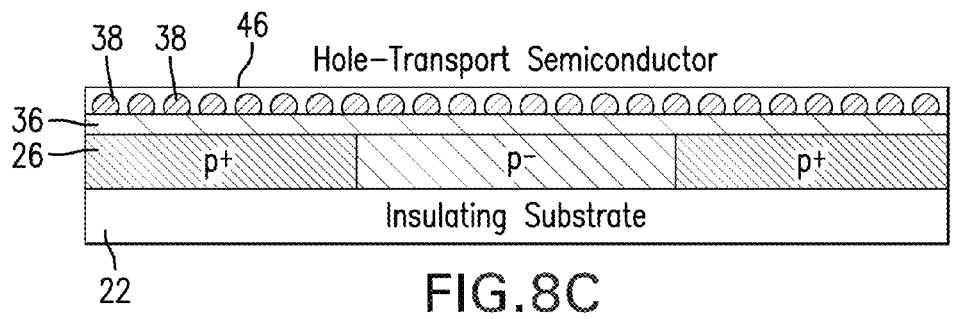
Figure 8D:
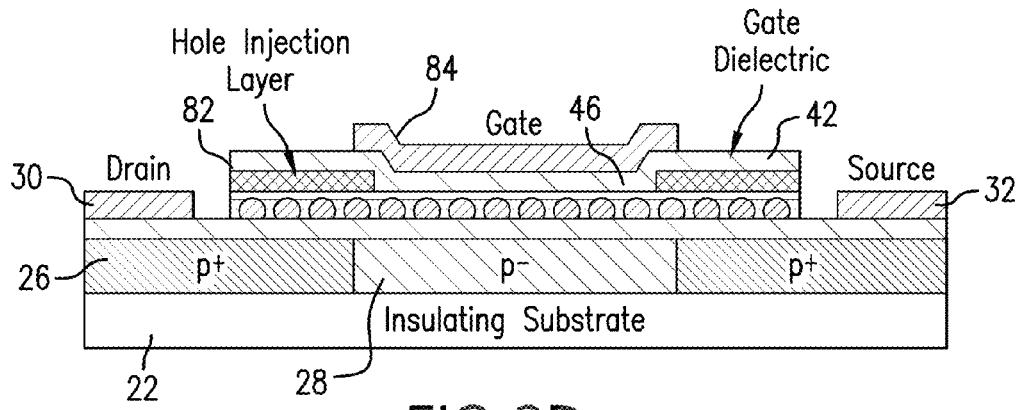

Given the discussion thus far and with reference to the exemplary embodiments discussed above and the drawings, it will be appreciated that, in general terms, an exemplary field-effect floating gate memory device includes a channel region 28 having a conductivity type and adjoining an electrically insulating substrate 22. Doped source and drain regions 26 are operatively associated with and have the same conductivity type as the channel region. In the structure 20 shown in FIG. 1, the channel region and associated source and drain regions are p-type. (The term "p-type" is understood as referring to semiconductor materials containing acceptor impurities such that holes are the majority carriers.) The device 90 shown in FIG. 9 includes n-type channel, source and drain regions. A gate 44 is operatively associated with the channel. A charge storage region 34 (element 98 in FIG. 9) including a semiconductor layer containing quantum structures such as quantum dots 38 and/or deep traps is between the gate and channel region. Carrier injection regions (26 in FIG. 1, 104 in FIG. 9) are in direct contact with the charge storage region for providing charges to the quantum structures and/or deep traps. A first dielectric layer is between the channel region and the charge storage region and a second dielectric layer is between the gate and the charge storage region. The carrier injection regions are metal in some embodiments and p-type semiconductor regions in some embodiments. The charge storage region includes quantum dots that directly contact the dielectric layer over the channel region 28 in one or more embodiments, such as shown in FIG. 8D. In some embodiments, such as described above with respect to FIG. 9, the semiconductor layer 100 is n-type, the channel region 92 is n-type and the carrier injection regions 104 are p+ regions such that, upon application of a negative gate bias, holes are induced in the quantum structures and/or deep traps and the channel region 92 remains fully depleted. It will be further appreciated that in general terms, if the carriers trapped in the charge storage regions are holes, a normally-ON device comprised of a p-type channel region can be programmed to the OFF state; while a normally-OFF device comprised of an n-type channel region can be programmed to the ON state. Similarly, if the carriers trapped in the charge storage regions are electrons, a normally-ON device comprised of an n-type channel region can be programmed to the OFF state; while a normally-OFF device comprised of a p-type channel region can be programmed to the ON state. The OFF state refers to a channel which is fully depleted, while the ON state refers to a channel which is not fully depleted. A channel which is not fully depleted (also referred to as un-depleted), may be partially depleted, in flat-band conditions, or accumulated.

An exemplary method includes providing a structure including an electrically insulating substrate, a channel region adjoining the electrically insulating substrate, and doped source and drain regions operatively associated with the channel region, the channel region and doped source and drain regions having the same conductivity type. A first dielectric layer is formed on the channel region. FIG. 8A shows an exemplary structure following deposition of a first dielectric layer. A charge storage region is formed on the first dielectric layer, the charge storage region including a semiconductor layer containing quantum structures such as quantum dots and/or deep traps. FIG. 8C shows an exemplary structure following formation of a charge storage region. A carrier injection layer is formed in direct contact with the charge storage region for providing charges to the quantum structures and/or deep traps, a gate dielectric layer is formed on the charge storage region, and a gate is formed on the gate dielectric layer. FIG. 8D shows a structure wherein the carrier injection layer is a hole injection layer 82 such as a gold layer or a p-type semiconductor region. Retention time in the charge storage region is generally better for holes than electrons in many materials as they have a greater effective mass. Electron injection and retention are, however, contemplated in one or more embodiments. The quantum structures are gold nanodots in some exemplary embodiments and germanium nanodots in other exemplary embodiments.

An exemplary method of performing a write function using an exemplary device is further provided. Such a method includes providing a field-effect floating gate memory device including a channel region having a conductivity type and adjoining an electrically insulating substrate, doped source and drain regions operatively associated with and having the same conductivity type as the channel region, a gate operatively associated with the channel, a charge storage region including a semiconductor layer containing quantum structures and/or deep traps between the gate and channel, carrier injection regions in direct contact with the charge storage region for providing charges to the quantum structures and/or deep traps, a first dielectric layer between the channel region and the charge storage region, and a second dielectric layer between the gate and the charge storage region. Exemplary devices 20, 90 are shown in FIGS. 1 and 9, respectively. A gate bias is applied, causing the injection of carriers (holes or electrons) into the charge storage region. The carriers are retained by the quantum structures and/or deep traps.

Those skilled in the art will appreciate that the exemplary structures discussed above can be distributed in raw form or incorporated as parts of intermediate products or end products that benefit from having memory switches that combine the functions of pass transistors and memory cells therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A field-effect floating gate memory device comprising:
   a channel region having a conductivity type and adjoining an electrically insulating substrate;
   doped source and drain regions operatively associated with and having the same conductivity type as the channel region;
   a gate operatively associated with the channel region;
   a charge storage region including a semiconductor layer containing quantum structures, deep traps or a combination thereof, the charge storage region being located between the gate and channel region;
   carrier injection regions in direct contact with the charge storage region for providing charges to the quantum structures and/or deep traps;
   a first dielectric layer between the channel region and the charge storage region, and
   a second dielectric layer between the gate and the charge storage region.

2. The field-effect floating gate memory device of claim 1, wherein the semiconductor layer of the channel storage region is an intrinsic semiconductor layer.

3. The field-effect floating gate memory device of claim 1, wherein the carrier injection regions are p+ regions for inducing holes in the quantum structures and/or deep traps.

4. The field-effect floating gate memory device of claim 3, wherein the channel region and source and drain regions are p-type.

5. The field-effect floating gate memory device of claim 1, wherein the charge storage region comprises quantum dots in direct contact with the first dielectric layer.

6. The field-effect floating gate memory device of claim 1, wherein the charge storage region includes an organic semiconductor layer containing a self-assembled monolayer of gold adjoining one of the first and second dielectric layers.

7. The field-effect floating gate memory device of claim 1, wherein the charge storage region includes germanium nano-dots and the semiconductor layer comprises silicon.

8. The field-effect floating gate memory device of claim 7, wherein the semiconductor layer includes n-type doping.

9. The field-effect floating gate memory device of claim 1, wherein the semiconductor layer is n-type, the channel region is n-type and the carrier injection regions are p-type regions such that, upon application of a negative gate bias, holes are induced in the quantum structures and/or deep traps and the channel region remains fully depleted.

10. A method comprising:
    providing a structure including an electrically insulating substrate, a channel region adjoining the electrically insulating substrate, and doped source and drain regions operatively associated with the channel region, the channel region and doped source and drain regions having the same conductivity type;
    forming a first dielectric layer on the channel region;
    forming a charge storage region on the first dielectric layer, the charge storage region including a semiconductor layer containing quantum structures, deep traps or a combination thereof;
    forming a carrier injection layer in direct contact with the charge storage region for providing charges to the quantum structures and/or deep traps;
    forming a gate dielectric layer on the charge storage region, and
    forming a gate on the gate dielectric layer.

11. The method of claim 10, wherein the semiconductor layer is a hole-transport layer and the carrier injection layer is a hole injection layer.

12. The method of claim 10, wherein the carrier injection layer includes a p-type semiconductor contact region.

13. The method of claim 10, wherein the carrier injection layer includes a metal layer.

14. The method of claim 10, wherein the charge storage region includes germanium nano-dots, further including the step of forming the germanium nano-dots on the first dielectric layer.

15. The method of claim 10, wherein the charge storage region includes gold nano-dots, further including the step of forming the gold nano-dots on the first dielectric layer.

16. The method of claim 10, wherein the channel region and source and drain regions are p-type.

17. A method comprising:
    providing a field-effect floating gate memory device including:
        a channel region having a conductivity type and adjoining an electrically insulating substrate;
        doped source and drain regions operatively associated with and having the same conductivity type as the channel region;
        a gate operatively associated with the channel;
        a charge storage region comprising a semiconductor layer containing quantum structures, deep traps or a combination thereof, between the gate and channel;
        carrier injection regions in direct contact with the charge storage region for providing charges to the quantum structures and/or deep traps;
        a first dielectric layer between the channel region and the charge storage region, and
        a second dielectric layer between the gate and the charge storage region;
    applying a gate bias, causing the injection of carriers into the charge storage region, and
    causing the carriers to be retained by the quantum structures and/or deep traps.

18. The method of claim 17 wherein the gate bias is a negative gate bias and the carriers are holes.

19. The method of claim 18, further including applying a positive gate bias to remove the holes from the quantum structures and/or deep traps.

20. The method of claim 18, further including maintaining the gate at positive idle voltage following the injection of holes.

* * * * *